(12) United States Patent
Parkhe

(10) Patent No.: US 12,125,734 B2
(45) Date of Patent: Oct. 22, 2024

(54) VACUUM SEAL FOR ELECTROSTATIC CHUCK

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 252 days.

(21) Appl. No.: 17/885,367

(22) Filed: Aug. 10, 2022

(65) Prior Publication Data

US 2024/0055289 A1   Feb. 15, 2024

(51) Int. Cl.
| | |
|---|---|
| *H01L 21/00* | (2006.01) |
| *C23C 16/458* | (2006.01) |
| *H01J 37/32* | (2006.01) |
| *H01L 21/683* | (2006.01) |

(52) U.S. Cl.
CPC ...... *H01L 21/6833* (2013.01); *C23C 16/4583* (2013.01); *H01J 37/32724* (2013.01)

(58) Field of Classification Search
CPC ............. H01L 21/6833; C23C 16/4583; H01J 37/32724
See application file for complete search history.

(56) References Cited

U.S. PATENT DOCUMENTS

| | | |
|---|---|---|
| 2010/0244350 A1 | 9/2010 | Fujisato et al. |
| 2013/0220989 A1 | 8/2013 | Pease et al. |
| 2018/0254211 A1 * | 9/2018 | Kosakai ............... H01L 21/683 |
| 2019/0189492 A1 | 6/2019 | Parkhe |
| 2019/0393068 A1 * | 12/2019 | Minemura ........ H01J 37/32724 |
| 2020/0035535 A1 * | 1/2020 | Parkhe ............. H01L 21/67103 |
| 2020/0185248 A1 | 6/2020 | Sarode Vishwanath et al. |
| 2020/0343125 A1 | 10/2020 | Kinpara et al. |

FOREIGN PATENT DOCUMENTS

| | | |
|---|---|---|
| CN | 104377155 B | 6/2017 |
| KR | 20060094912 A | 8/2006 |

OTHER PUBLICATIONS

Application No. PCT/US2023/029339, International Search Report and the Written Opinion, Mailed on Nov. 21, 2023, 9 pages.

* cited by examiner

*Primary Examiner* — Pete T Lee
(74) *Attorney, Agent, or Firm* — Kilpatrick Townsend & Stockton LLP

(57) ABSTRACT

Exemplary substrate support assemblies may include an electrostatic chuck body. The body may include a support plate defining a substrate support surface. The body may include a base plate coupled with the support plate. A bottom surface of the base plate may define an annular recess. The body may include a cooling plate coupled with the base plate. The assemblies may include a support stem coupled with the body. The assemblies may include a heater embedded within the body. The assemblies may include one or more electrodes embedded within the body. The assemblies may include an annular plate disposed within the annular recess. The annular plate may have a thermal conductivity of less than about 20 W/mK. The assemblies may include a vacuum sealing element disposed between the annular plate and the cooling plate. The assemblies may include a thermal gasket disposed radially inward of the vacuum sealing element.

20 Claims, 5 Drawing Sheets

VACUUM SEAL FOR ELECTROSTATIC CHUCK

TECHNICAL FIELD

The present technology relates to components and apparatuses for semiconductor manufacturing. More specifically, the present technology relates to substrate support assemblies and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. The substrate support may also be utilized in some technologies to develop a substrate-level plasma, as well as to chuck the substrate to the support electrostatically. Plasma generated near the substrate may cause bombardment of components, as well as parasitic plasma formation in unfavorable regions of the chamber. The conditions may also lead to discharge between substrate support electrodes. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

BRIEF SUMMARY OF THE INVENTION

Exemplary substrate support assemblies may include an electrostatic chuck body. The chuck body may include a support plate defining a substrate support surface. The chuck body may include a base plate coupled with the support plate opposite the substrate support surface. A bottom surface of the base plate may define an annular recess. The chuck body may include a cooling plate coupled with the bottom surface of the base plate opposite the support plate. The assemblies may include a support stem coupled with the electrostatic chuck body. The assemblies may include a heater embedded within the electrostatic chuck body. The assemblies may include one or more electrodes embedded within the electrostatic chuck body and spaced apart from the heater. The assemblies may include an annular plate disposed within the annular recess. The annular plate may have a thermal conductivity of less than about 20 W/mK. The assemblies may include a vacuum sealing element disposed between the annular plate and the cooling plate. The assemblies may include a thermal gasket disposed radially inward of the vacuum sealing element.

In some embodiments, the annular recess may extend through a peripheral edge of the base plate. The annular plate may have a thickness of less than about 2 mm. The annular plate may have a width of between about 2 mm and 20 mm. A top surface of the cooling plate may define an annular groove. The vacuum sealing element may be seated within the annular groove. The electrostatic chuck body may define a plurality of lift pin apertures. The bottom surface of the base plate may define additional annular recesses about each of the plurality of lift pin apertures. The assemblies may include additional annular plates. Each of the additional annular plates may be seated within a respective one of the additional annular recesses. The assemblies may include additional vacuum sealing elements. Each of the additional vacuum sealing elements may be disposed between the cooling plate and a respective one of the additional annular plates. The annular plate may include a fluorine-resistant material. A coefficient of thermal expansion of the annular plate may be within about 10% of a coefficient of thermal expansion of the base plate. The one or more electrodes may be disposed within the support plate. The heater may be disposed within the base plate.

Some embodiments of the present technology may encompass substrate support assemblies that may include an electrostatic chuck body. The chuck body may include a support plate defining a substrate support surface. The chuck body may include a base plate coupled with the support plate opposite the substrate support surface. A bottom surface of the base plate may define an annular recess. The chuck body may include a cooling plate coupled with the bottom surface of the base plate opposite the support plate. The assemblies may include a heater embedded within the electrostatic chuck body. The assemblies may include one or more electrodes embedded within the electrostatic chuck body and spaced apart from the heater. The assemblies may include an annular plate disposed within the annular recess. The annular plate may have a thermal conductivity of less than about 20 W/mK. The assemblies may include a vacuum sealing element disposed between the annular plate and the cooling plate.

In some embodiments, the annular plate may have a thermal conductivity of less than about 5 W/mK. The assemblies may include a thermal gasket disposed radially inward of the vacuum sealing element. A thickness of the thermal gasket may be less than about 2 mm. The vacuum sealing element may include a perfluoropolymer. The electrostatic chuck body may define a backside gas channel that extends through a thickness of the electrostatic chuck body and through the substrate support surface. The bottom surface of the base plate may define an additional annular recess about the backside gas channel. The assemblies may include an additional annular plate seated within the additional annular recess. The assemblies may include an additional vacuum sealing element disposed between the cooling plate and the backside gas channel. The annular channel may be disposed radially inward of a peripheral edge of the base plate. A coefficient of thermal expansion of the annular plate may be between about 4.7 and 5.

Some embodiments of the present technology may encompass substrate support assemblies that may include one or more upper plates. An uppermost plate of the one or more plates may define a substrate support surface. A bottom surface of a lowermost plate of the one or more plates may define an annular recess. The assemblies may include a cooling plate coupled with the bottom surface of the lowermost plate. The assemblies may include a heater embedded within one of the one or more plates. The assemblies may include an electrode embedded within one of the one or more plates and spaced apart from the heater. The assemblies may include an annular plate disposed within the annular recess. The annular plate may have a thermal conductivity of less than about 20 W/mK. The assemblies may include a vacuum sealing element disposed between the annular plate and the cooling plate. In some embodiments, the lowermost plate and the uppermost plate may be the same plate.

Such technology may provide numerous benefits over conventional systems and techniques. For example, embodiments of the present technology may provide electrostatic chuck mechanisms that may operate at high temperatures without degradation of sealing mechanisms that seal the interior of the chuck mechanism from the vacuum conditions of a processing chamber. Such chuck mechanisms may enable standard sealing elements to be used in high temperature processing conditions, which may reduce the cost and complexity of the chuck mechanism. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
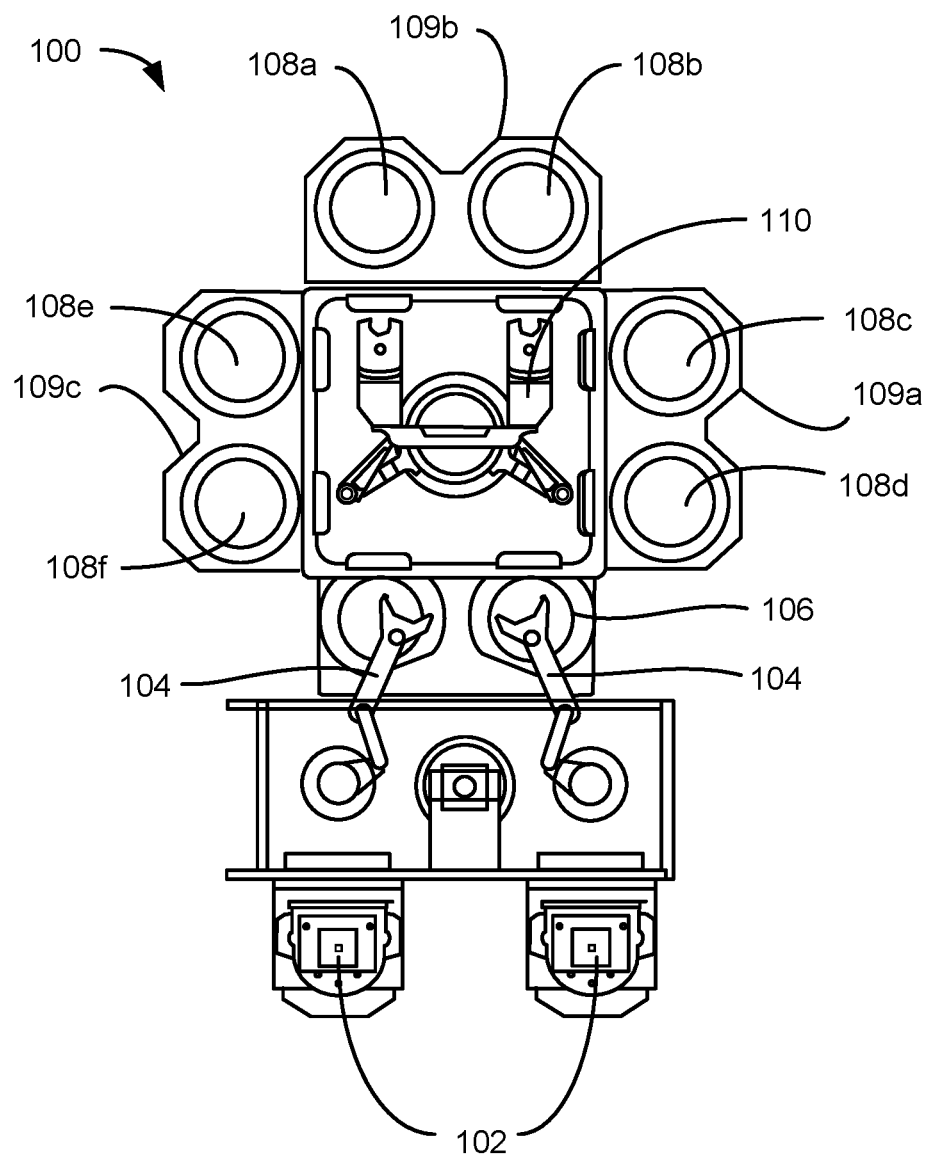
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Plasma enhanced deposition processes may energize one or more constituent precursors to facilitate film formation on a substrate. Oftentimes, these processes are performed using pedestals that include heaters which may heat and control the substrate temperature at a desired process temperature. The plasma is generated by exothermic reactions, which may generate significant amounts of heat. While many operations may be performed at sufficiently high temperature to overcome a heat effect from the plasma, when operations occur at mid-range temperatures, such as above or about 100° C. but less than or about 500° C., or less, heat from the plasma may impact the process. This heat, along with heat due to ion bombardment during plasma formation, may exceed the amount of heat that may be dissipated by conventional pedestals to maintain a setpoint temperature. Such high temperatures may cause sealing elements, such as O-rings and gaskets that are used to seal the interior of the chuck mechanism from the vacuum conditions of a processing chamber, to fail.

The present technology may incorporate substrate support assemblies that may include components that isolate the sealing elements from the highest temperatures within the chamber. For example, one or more annular plates may be provided within grooves of a base plate of a chuck body. These annular plates may be formed of a material with a lower thermal conductivity than the base plate, and may be positioned above and/or otherwise aligned with the sealing elements. This may enable the annular plates to thermally isolate or otherwise shield the sealing elements from the higher temperatures of the base plate during processing operations. Such thermal isolation may provide a temperature reduction that is sufficient to enable conventional sealing elements (such as perfluoropolymer O-rings and gaskets) to be utilized in high temperature processing operations (e.g., where temperatures exceed 350° C.), without the risk of thermal degradation of the sealing element.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108*a*-*b*, may be used to etch the deposited dielectric. In another configuration, all three pairs of chambers, e.g., 108*a*-*f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
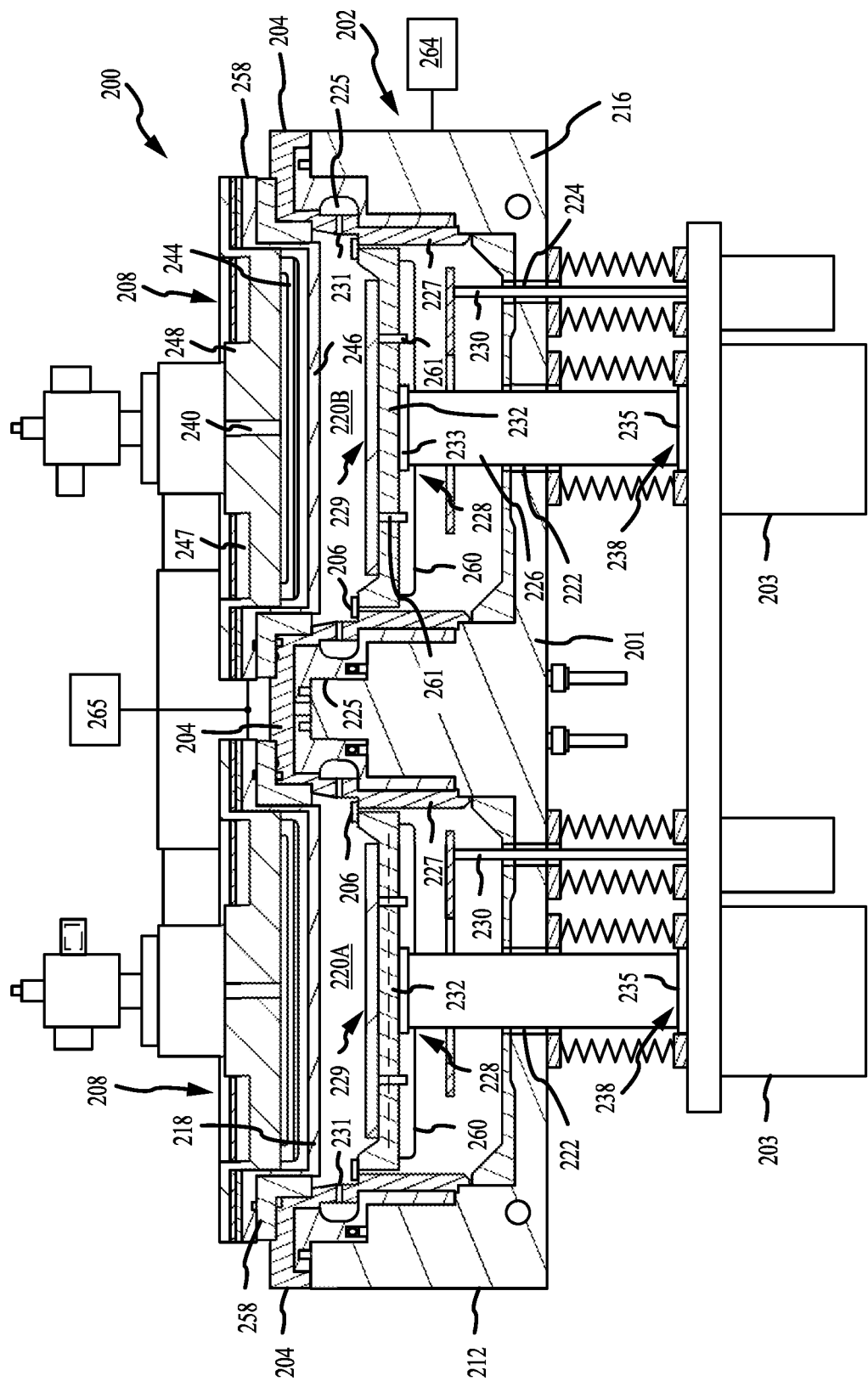
FIG. 2 shows a schematic cross-sectional view of an exemplary processing system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
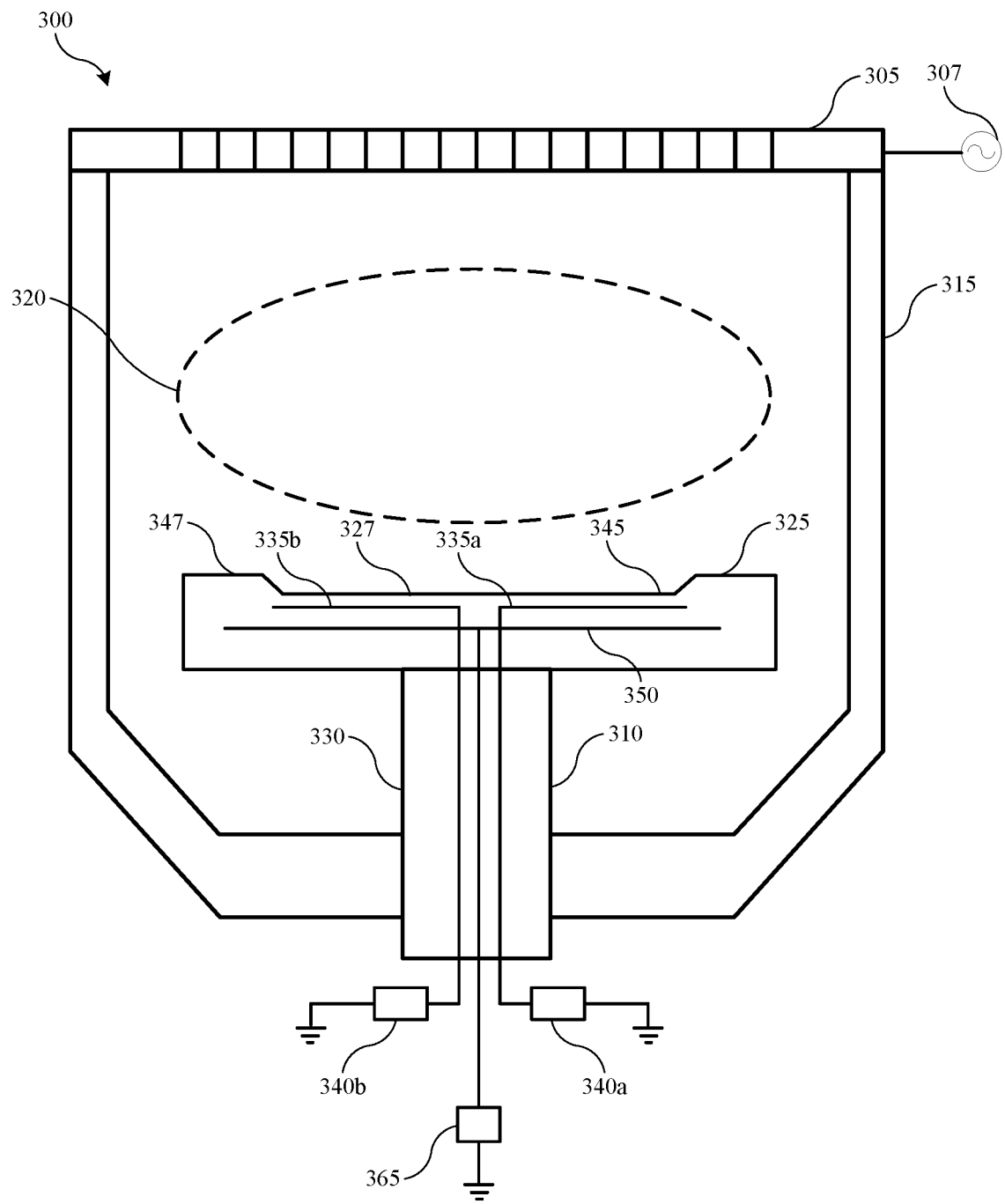
FIG. 3 shows a schematic partial cross-sectional view of an exemplary processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. In some embodiments, the electrostatic chuck body 325 may be formed from a conductive material (such as a metal like aluminum or any other material that may be thermally and or electrically conductive) and may be coupled with a source of electric power (such as DC power, pulsed DC power, RF bias power, a pulsed RF source or bias power, or a combination of these or other power sources) through a filter, which may be an impedance matching circuit to enable the electrostatic chuck body 325 to operate as an electrode. In other embodiments, a top portion of the electrostatic chuck body 325 may be formed from a dielectric material. In such embodiments, the electrostatic chuck body 325 may include separate electrodes. For example, the electrostatic chuck body 325 may include a first bipolar electrode 335a, which may be embedded within the chuck body proximate the substrate support surface. Electrode 335a may be electrically coupled with a DC power source 340a. Power source 340a may be configured to provide energy or voltage to the electrically conductive chuck electrode 335a. This may be operated to form a plasma of a precursor within the processing region 320 of the semiconductor processing chamber 300, although other plasma operations may similarly be sustained. For example, electrode 335a may also be a chucking mesh that operates as electrical ground for a capacitive plasma system including an RF source 307 electrically coupled with showerhead 305. For example, electrode 335a may operate as a ground path for RF power from the RF source 307, while also operating as an electric bias to the substrate to provide electrostatic clamping of the substrate to the substrate support surface. Power source 340a may include a filter, a power supply, and a number of other electrical components configured to provide a chucking voltage.

The electrostatic chuck body may also include a second bipolar electrode 335b, which may also be embedded within the chuck body proximate the substrate support surface. Electrode 335b may be electrically coupled with a DC power source 340b. Power source 340b may be configured to provide energy or voltage to the electrically conductive chuck electrode 335b. Additionally electrical components and details about bipolar chucks according to some embodiments will be described further below, and any of the designs may be implemented with processing chamber 300. For example, additional plasma related power supplies or components may be incorporated.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340a and 340b may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. If present, the chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges, as well as less than any of the stated temperatures.

Figure 4:
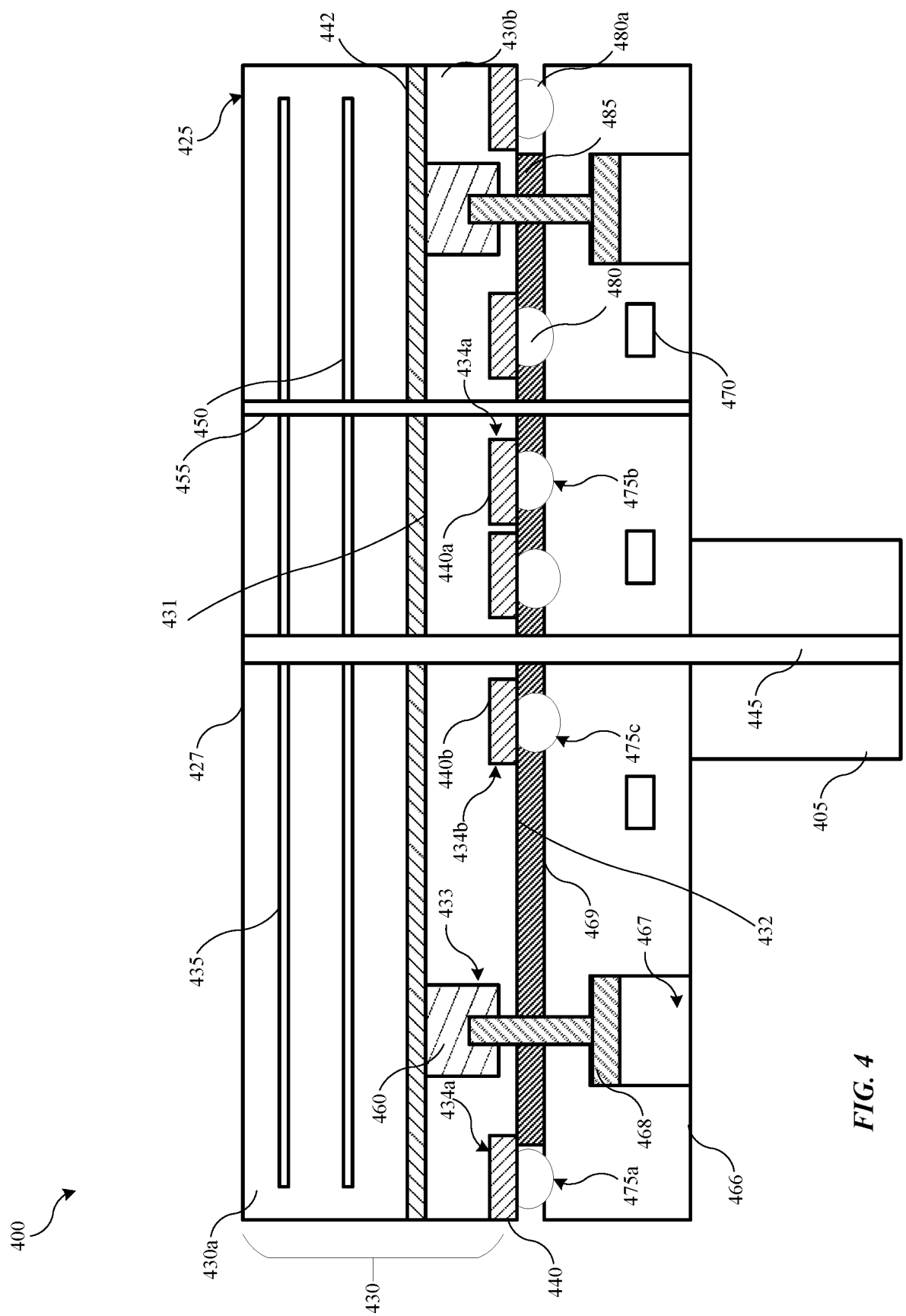
FIG. 4 shows a schematic partial cross-sectional view of an exemplary substrate support assembly according to some embodiments of the present technology.

FIG. 4 shows a schematic partial cross-sectional view of a substrate support assembly 400 according to some embodiments of the present technology. As explained above, the present technology may be used in some embodiments to perform film depositions and cures within a single chamber. Substrate support assembly 400 may be similar to substrate support assembly 310, and may include any feature, component, or characteristic of the support described above, including any associated components or power supplies. Substrate support assembly 400 may include a support stem 405, which may be a conductive material. An electrostatic chuck body 425, which may include one or more components embedded or disposed within the body, may be positioned atop the support stem 405. The components incorporated within the top puck may not be exposed to processing materials in some embodiments, and may be fully retained within the chuck body 425. Electrostatic chuck body 425 may define a substrate support surface 427, and may be characterized by a thickness and length or diameter depending on the specific geometry of the chuck body. In some embodiments the chuck body 425 may be elliptical, and may be characterized by one or more radial dimensions from a central axis through the chuck body. It is to be understood that the top puck may be any geometry, and when radial dimensions are discussed, they may define any length from a central position of the chuck body 425.

The electrostatic chuck body 425 may include a number of plates that are coupled together. For example, the electrostatic chuck body 425 may include one or more upper plates 430, which may be formed from an insulative (e.g., having an electrical resistivity of greater than $10^{14}$ Ohmmeter) or dielectric material. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. As illustrated, the upper plates 430 may include a support plate 430a and a base plate 430b that are bonded and/or otherwise coupled with one another. For example, the support plate 430a and base plate 430b may be bonded using metallic bonding techniques, such as diffusion bonding, brazing, and/or other bonding techniques may be used to couple the upper plates 430 together. In some embodiments, the bonding technique may include forming a metallic interlayer 442, such as aluminum or other metal, between adjacent upper plates 430 to bond the upper plates 430 together.

The electrostatic chuck body 425 may include a heater 450, such as an AC heating coil. In some embodiments, the heater 450 may be formed from a conductive wire, such as a wire formed from nickel chromium. An insulating shell may be provided about the heater 450 to prevent shorting. The heater 450 may be formed from one or more heating elements. As just one example, conductive wire may be provided in a radially expanding spiral or other circuitous shape within the electrostatic chuck body 425 to provide relatively uniform heating across the substrate support surface 427. Each heating element of the heater 450 may be coupled with a power source, such as an AC power source that delivers AC current to the heater 450, to heat the top puck. The current may be delivered to the heater 450 through one or more rods or wires (not shown) that are disposed within channel formed within the stem 405 and the electrostatic chuck body 425. A temperature sensor may extend along the rods or wires in some embodiments. The heater 450 may have a range of operating temperatures to heat the chuck body 425 and/or a substrate above or about 100° C., and the heater 450 may be configured to heat above or about 125° C., above or about 150° C., above or about 175° C., above or about 200° C., above or about 250° C., above or about 300° C., or higher. The heater 450 may also be configured to operate in any range encompassed between any two of these stated numbers, or smaller ranges encompassed within any of these ranges.

The electrostatic chuck body 425 may include one or more electrodes 435, which may be used as chucking electrodes to clamp a substrate against the substrate support surface 427. Each electrode 435 may be electrically coupled with a DC power source that may provide energy or voltage to the electrode 435. The electrodes 435 may be a chucking mesh that operates as electrical ground for a capacitive plasma system including an RF source electrically coupled with showerhead. For example, each electrode 435 may operate as a ground path for RF power from the RF source, while also operating as an electric bias to the substrate to provide electrostatic clamping of the substrate to the substrate support surface.

The heater 450 and each electrode 435 may be disposed embedded within the electrostatic chuck body 425. For example, the electrodes 435 may be embedded within the electrostatic chuck body 425 proximate the substrate support surface 427, while the heater 450 may be spaced apart from the electrodes 435, such as being disposed further away from the substrate support surface 427. In some embodiments, the heater 450 and electrodes 435 may be embedded within a same upper plate 430 (e.g., the support plate 430a), while in other embodiments the heater 450 and electrodes 435 may be disposed in separate upper plates 430. For example, the electrodes 435 may be disposed within the support plate 430a and the heater 450 may be disposed within the base plate 430b.

An uppermost plate (e.g., support plate 430a) of the upper plates 430 may define the substrate support surface 427, with one or more upper plates 430 (e.g., base plate 430b) being coupled with the uppermost plate opposite the substrate support surface 427. In some embodiments, the uppermost plate and the lowermost plate may be the same plate, such as when the one or more upper plates 430 include only support plate 430a. A bottom surface 432 of the lowermost plate (e.g., support plate 430a in single upper plate embodiments or base plate 430b in dual-upper plate embodiments) may define an annular recess 434. The annular recess 434 may extend through a peripheral edge of the lowermost plate (e.g., base plate 430b) as illustrated here such that the annular recess 434 includes or is defined by only an upper wall and inner wall. In other embodiments, the annular recess 434 may be inset radially inward relative to the peripheral edge of the lowermost plate such that the annular recess 434 includes or is defined by an inner wall, an upper wall, and an outer wall.

The annular recess 434 may have a depth of less than about 2 mm. For example, the depth of the annular recess 434 may be between or about 0.1 mm and 2 mm, between or about 0.15 mm and 1.75 mm, between or about 0.2 mm and 1.5 mm, between or about 0.25 mm and 1.25 mm, between or about 0.3 mm and 1 mm, between or about 0.35 mm and 0.75 mm, or between or about 0.4 mm and 0.5 mm. A width of the annular recess 434 may be between or about 2 mm and 20 mm, between or about 3 mm and 18 mm, between or about 4 mm and 16 mm, between or about 5 mm and 14 mm, between or about 6 mm and 12 mm, or between or about 7 mm and 10 mm.

An annular plate 440 may be disposed within the annular recess 434. For example, the annular plate 440 may be seated against one or more surfaces that define the annular recess 434. In some embodiments, the annular plate 440 may have similar dimensions as the annular recess 434 such that the annular plate 440 at least substantially fills the annular recess 434. For example, the annular plate 440 may have a thickness of between or about 0.1 mm and 2 mm, between or about 0.15 mm and 1.75 mm, between or about 0.2 mm and 1.5 mm, between or about 0.25 mm and 1.25 mm, between or about 0.3 mm and 1 mm, between or about 0.35 mm and 0.75 mm, or between or about 0.4 mm and 0.5 mm. Such a thickness may enable a bottom surface of the annular plate 440 to be substantially flush with a bottom surface of the lowermost plate (e.g., base plate 430b) in some embodiments, although in other embodiments the annular plate 440 may have a thickness that is greater than or less than a depth of the annular recess 434 such that the bottom surface of the annular plate 440 is recessed or protrudes relative to the bottom surface of the lowermost plate. A width of the annular plate 440 may be between or about 2 mm and 20 mm, between or about 3 mm and 18 mm, between or about 4 mm and 16 mm, between or about 5 mm and 14 mm, between or about 6 mm and 12 mm, or between or about 7 mm and 10 mm.

The annular plate 440 may be formed from a material that has a thermal conductivity or less than or about 20 W/mK, less than or about 15 W/mK, less than or about 10 W/mK, less than or about 5 W/mK, less than or about 3 W/mK, less than or about 1 W/mK, less than or about 0.8 W/mK, less than or about 0.6 W/mK, less than or about 0.4 W/mK, less than or about 0.2 W/mK, or less, which may enable the annular plate 440 to isolate sealing elements or other components from high temperatures of the upper plates 430 caused by the heater 450. The annular plate 440 may be formed from a material that has a coefficient of thermal expansion that is within about 10% of a coefficient of friction of the lowermost plate, within about 8%, within about 6%, within about 5%, within about 3%, within about 1%, or less. In a particular embodiment, the lowermost plate and the annular plate 440 may each have a coefficient of thermal expansion of between or about 4.5 and 5.5, between or about 4.6 and 5.25, or between or about 4.7 and 5. In some embodiments, the annular plate 440 may be formed from or otherwise include a fluorine-resistant material. Suitable materials for the annular plate 440 may include, without limitation ceramic materials (such as aluminum oxide, aluminum nitride, silicon carbide, tungsten carbide, and any other metal or transition metal oxide, nitride, carbide, boride, or titanate, as well as combinations of these materials and other insulative or dielectric materials), glass, perofluoropolymers, polyamids, and the like. The annular plate 440 may be formed from fluorine-compatible material and/or coated with a fluorine-compatible material (such as a perofluoropolymer and/or inorganic coating (e.g., aluminum oxide)).

The electrostatic chuck body 425 may define a number of lift pin apertures 455 that may receive lift pins that are used to elevate substrates relative to the substrate support surface 427 during substrate transfer operations. The bottom surface 432 of the lowermost plate (e.g., support plate 430a in single upper plate embodiments or base plate 430b in dual-upper plate embodiments) may define an additional annular recess 434a about each of the lift pin apertures 455, with each additional annular recess 434a being similar to annular recess 434 in some embodiments. For example, in some embodiments, each additional annular recess 434a may have a similar depth and/or width as annular recess 434, although other dimensions are possible in various embodiments. For example, the width and/or depth of one or more of the additional annular recesses 434a may be smaller or larger than that of the annular recess 434. The size may be determined based on a size of the respective vacuum sealing element being disposed against the annular plate seated within the respective additional annular recess 434a, with the size of the additional annular plate 434a being selected to sufficiently thermally isolate the respective vacuum sealing element from the high temperatures exhibited by the upper plates 430. Each additional recess 434a may receive an additional annular plate 440a, which may be similar to annular plate 440 in some embodiments. For example, in some embodiments, each additional annular plate 440a may have a similar thickness and/or width as annular recess 434a, although other dimensions are possible in various embodiments.

Figure 4A:
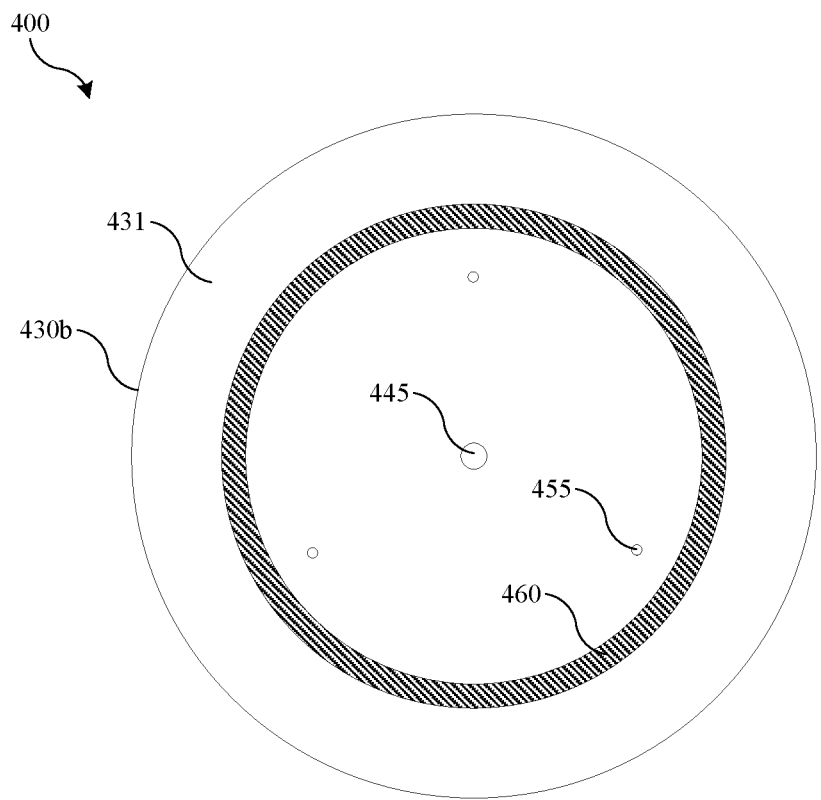
FIG. 4A shows a top plan view of the substrate support assembly of FIG. 4 according to some embodiments of the present technology.
Figure 4B:
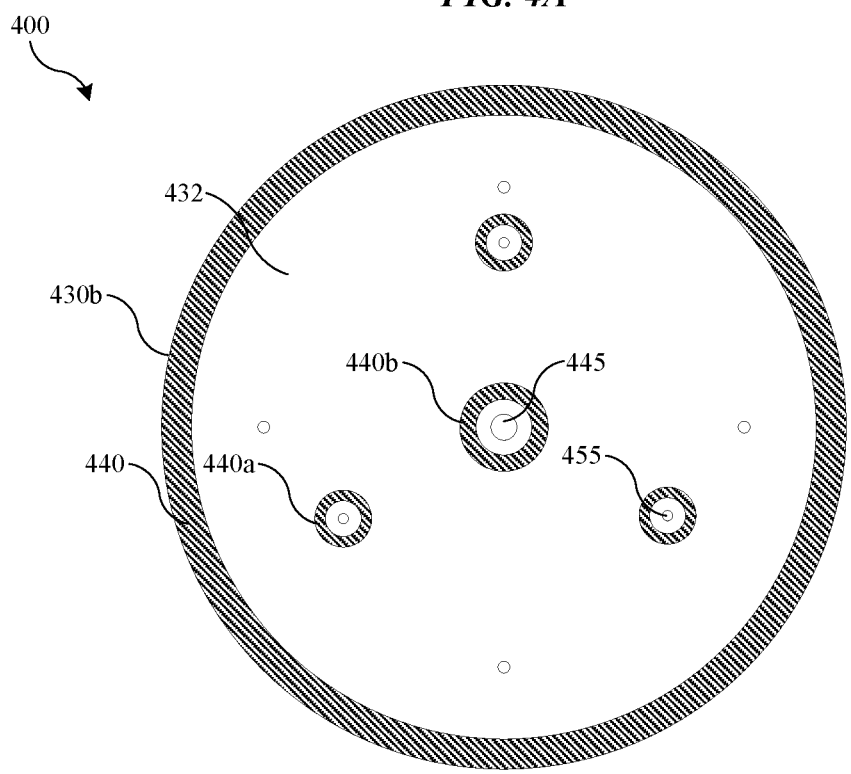
FIG. 4B shows a bottom plan view of a portion of the substrate support assembly of FIG. 4 that is above a cooling plate of the substrate support assembly according to some embodiments of the present technology.

As best illustrated in FIG. 4B, the electrostatic chuck body 425 may define one or more backside gas channels 445 that may extend through a thickness of the electrostatic chuck body 425 and that enable one or more gases, such as (but not limited to) purge gases, to be delivered to the backside of a substrate positioned atop the substrate support surface 427. Each backside gas channel 445 may be coupled with a gas source, such as a gas panel, that delivers the gas to the substrate receiving surface via the backside gas channels 445. The bottom surface 432 of the lowermost plate (e.g., support plate 430a in single upper plate embodiments or base plate 430b in dual-upper plate embodiments) may define an additional annular recess 434b about the backside gas channel 445, with the additional annular recess 434b being similar to annular recess 434 in some embodiments. For example, in some embodiments, each additional annular recess 434b may have a similar depth and/or width as annular recess 434, although other dimensions are possible in various embodiments. For example, the width and/or depth of one or more of the additional annular recesses 434b may be smaller or larger than that of the annular recess 434. The size may be determined based on a size of the respective vacuum sealing element being disposed against the annular plate seated within the respective additional annular recess

434b, with the size of the additional annular plate 434b being selected to sufficiently thermally isolate the respective vacuum sealing element from the high temperatures exhibited by the upper plates 430. Each additional recess 434b may receive an additional annular plate 440b, which may be similar to annular plate 440 in some embodiments. For example, in some embodiments, each additional annular plate 440b may have a similar thickness and/or width as annular plate 440, although other dimensions are possible in various embodiments.

An upper surface 431 of the base plate 430b may define an annular recess 433, which may receive a fastening plate 460 as best illustrated in FIG. 4A. Fastening plate 460 may be formed from a machinable material, such as a metal or polymeric material that may be machined to include a number of threaded apertures that may receive fasteners used to secured additional components of the electrostatic chuck body 425 to the upper plates 430 as will be discussed in greater detail below. FIG. 4B illustrates the annular plate 434, additional annular plates 434a, and additional annular plate 434b positioned about portions of the lift pin apertures 455 and backside gas channel 445 defined within base plate 430b (or other lowermost upper plate 430).

The electrostatic chuck body 425 may include a cooling plate 465 that is coupled with a lowermost plate of the upper plates 430 (as illustrated, base plate 430b). The cooling plate 465 may positioned beneath the upper plates 430 and may be directly or indirectly coupled with a top end of the support stem 405. The cooling plate 465 may be formed from a material having a high thermal conductivity. The high thermal conductivity helps dissipate excess heat away from the upper plates 430 to reduce thermal shift that may lead to film non-uniformity on the substrate. The material forming the cooling plate 465 may also have a coefficient of thermal expansion that is similar to that of the upper plates 430 to prevent damage or deformation of the electrostatic chuck body 425 during temperature fluctuations. For example, a difference between the coefficient of thermal expansion of the upper plates 430 and the cooling plate 465 may be less than or about 20%, less than or about 15%, less than or about 10%, less than or about 9%, less than or about 8%, less than or about 7%, less than or about 6%, less than or about 5%, less than or about 4%, less than or about 3%, less than or about 2%, less than or about 1%, or less. The cooling plate 465 may be fabricated from a metal such as aluminum, stainless steel, or other materials. Alternatively, the cooling plate 465 may be fabricated by a composite ceramic, such as an aluminum-silicon alloy infiltrated SiC or molybdenum to match a thermal expansion coefficient of the upper plates 430.

The cooling plate 465 may be coupled with the lowermost plate of the upper plates 430 (e.g., coupled with the base plate 430b opposite the support plate 430a in dual-plate embodiments), such as by using one or more fasteners. For example, a bottom surface 466 of the cooling plate 465 may define a number of counter bores 467 that may receive a head of a respective fastener 468 (such as a bolt) that may be used to fasten the cooling plate 465 to the lowermost plate of the upper plates 430. A threaded portion of each fastener 468 may extend through apertures formed in a thermal gasket 485 and be engage with threads formed within fastening plate 460 to secure the cooling plate 465 with the lowermost plate of the upper plates 430.

As part of the electrostatic chuck body 425, the cooling plate 465 may define a portion of each lift pin aperture 455 and each backside gas channel 445. The cooling plate 465 may define one or more cooling channels 470. In some embodiments, a top end of each cooling channel 470 may form an annular or other circuitous pattern about an interior of the cooling plate 465 and may couple with a cooling fluid source through an inlet and outlet channel through the support stem 405. A cooling fluid, such as water or galden, may be circulated through each cooling channel 470 to cool the lower portion of the electrostatic chuck body 425 to help dissipate excess heat generated during the plasma formation process, which may reduce or eliminate thermal shift and result in more uniform film deposition on the substrate. The cooling fluid may be circulated at a temperature below or about 125° C., below or about 120° C., below or about 115° C., below or about 110° C., below or about 105° C., below or about 100° C., below or about 95° C., below or about 90° C., below or about 85° C., below or about 80° C., below or about 75° C., below or about 70° C., below or about 65° C., below or about 60° C., below or about 55° C., below or about 50° C., or lower.

An upper surface 469 of the cooling plate 465 may define one or more annular grooves 475. Each groove 475 may be aligned with a respective one of the annular plates 440. For example, an outermost groove 475a may be aligned with the annular plate 440. If the electrostatic chuck body 425 includes lift pin apertures 455 and/or a backside gas channel 445, grooves 475b and 475c may be included and aligned with the additional annular plates 440a and 440b, respectively. Each groove 475 may be sized and shaped to receive a respective vacuum sealing element 480. Each vacuum sealing element 480 (such as an O-ring) may be seated within a respective groove 475 such that when the cooling plate 465 is fastened against the lowermost plate of the upper plates 430, the vacuum sealing element 480 may be compressed between the cooling plate 465 and a respective one of the annular plates 440. This may provide a vacuum seal to be formed, which may enable the pressures within the substrate support assembly 400 (which are often at atmospheric levels) to be different than those within the chamber environment and/or lift pin apertures 455 (which are often maintained at a vacuum). Additionally, a vacuum sealing element 480 may prevent any backside gas from flowing from the backside gas channel 445 to an interior of the electrostatic chuck body 425. The presence of the annular plates 440 may help isolate the vacuum sealing elements 480 from high temperatures exhibited by the upper plates 430 during processing operations, which may enable more conventional vacuum sealing elements 480 to be used. For example, the vacuum sealing elements 480 may be O-rings that are formed from perfluoropolymer (PFP). Alternatively, other types of high temperature O-rings may be used. In one embodiment, thermally insulating high temperature O-rings are used. The O-ring may be a stepped O-ring having a first step at a first thickness and a second step at a second thickness. This may facilitate uniform tightening of fasteners by causing the amount of force used to tighten the fasteners to increase dramatically after a set amount of compression of the O-ring. Additional grooves and/or O-rings (not shown) may also be disposed on the top side of the cooling plate 465 around a holes through which cables and/or other components of the substrate support assembly 400 are run.

The substrate support assembly 400 may include a thermal gasket 485 that is disposed between at least a portion of the base plate 430b (or other lowermost plate of the upper plates 430) and the cooling plate 465. For example, the thermal gasket 485 may be disposed radially inward of vacuum sealing element 480a that is disposed most radially outward (e.g., seated within groove 475a) and may define a number of apertures to provide access for fasteners 468, lift pin apertures 455, backside gas channels 445, and/or other features of the electrostatic chuck body 425. In some embodiments, the thermal gasket 485 may be formed from a PFP, such as Dupont's™ ECCtreme™, Dupont's KAL-REZ® and Daikin's® DUPRA™. Alternatively, the gasket may be a stack of alternating layers of grafoil and polyimide. The thermal gasket 485 may have a thickness of between or about 0.1 mm and 2 mm, between or about 0.15 mm and 1.75 mm, between or about 0.2 mm and 1.5 mm, between or about 0.25 mm and 1.25 mm, between or about 0.3 mm and 1 mm, between or about 0.35 mm and 0.75 mm, or between or about 0.4 mm and 0.5 mm.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the rod" includes reference to one or more rods and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly comprising:
   an electrostatic chuck body, comprising:
      a support plate defining a substrate support surface;
      a base plate coupled with the support plate opposite the substrate support surface, wherein a bottom surface of the base plate defines an annular recess; and
      a cooling plate coupled with the bottom surface of the base plate opposite the support plate;
   a support stem coupled with the electrostatic chuck body;
   a heater embedded within the electrostatic chuck body;
   one or more electrodes embedded within the electrostatic chuck body and spaced apart from the heater;
   an annular plate disposed within the annular recess, the annular plate having a thermal conductivity of less than about 20 W/mK;
   a vacuum sealing element disposed between the annular plate and the cooling plate; and
   a thermal gasket disposed radially inward of the vacuum sealing element.

2. The substrate support assembly of claim 1, wherein:
   the annular recess extends through a peripheral edge of the base plate.

3. The substrate support assembly of claim 1, wherein:
   the annular plate has a thickness of less than about 2 mm.

4. The substrate support assembly of claim 1, wherein:
   the annular plate has a width of between about 2 mm and 20 mm.

5. The substrate support assembly of claim 1, wherein:
   a top surface of the cooling plate defines an annular groove; and
   the vacuum sealing element is seated within the annular groove.

6. The substrate support assembly of claim 1, wherein:
   the electrostatic chuck body defines a plurality of lift pin apertures;
   the bottom surface of the base plate defines additional annular recesses about each of the plurality of lift pin apertures;
   the substrate support assembly comprises additional annular plates;
   each of the additional annular plates is seated within a respective one of the additional annular recesses;
   the substrate support assembly comprises additional vacuum sealing elements; and
   each of the additional vacuum sealing elements is disposed between the cooling plate and a respective one of the additional annular plates.

7. The substrate support assembly of claim 1, wherein:
   the annular plate comprises a fluorine-resistant material.

8. The substrate support assembly of claim 1, wherein:
   a coefficient of thermal expansion of the annular plate is within about 10% of a coefficient of thermal expansion of the base plate.

9. The substrate support assembly of claim 1, wherein:
   the one or more electrodes are disposed within the support plate; and
   the heater is disposed within the base plate.

10. A substrate support assembly comprising:
    an electrostatic chuck body, comprising:
       a support plate defining a substrate support surface;
       a base plate coupled with the support plate opposite the substrate support surface, wherein a bottom surface of the base plate defines an annular recess; and
       a cooling plate coupled with the bottom surface of the base plate opposite the support plate;
    a heater embedded within the electrostatic chuck body;
    one or more electrodes embedded within the electrostatic chuck body and spaced apart from the heater;
    an annular plate disposed within the annular recess, the annular plate having a thermal conductivity of less than about 20 W/mK; and
    a vacuum sealing element disposed between the annular plate and the cooling plate.

11. The substrate support assembly of claim 10, wherein:
    the annular plate has a thermal conductivity of less than about 5 W/mK.

12. The substrate support assembly of claim 10, further comprising:
a thermal gasket disposed radially inward of the vacuum sealing element.

13. The substrate support assembly of claim 12, wherein: a thickness of the thermal gasket is less than about 2 mm.

14. The substrate support assembly of claim 10, wherein: the vacuum sealing element comprises a perfluoropolymer.

15. The substrate support assembly of claim 10, wherein: the electrostatic chuck body defines a backside gas channel that extends through a thickness of the electrostatic chuck body and through the substrate support surface.

16. The substrate support assembly of claim 15, wherein:
the bottom surface of the base plate defines an additional annular recess about the backside gas channel;
the substrate support assembly comprises an additional annular plate seated within the additional annular recess; and
the substrate support assembly comprises an additional vacuum sealing element disposed between the cooling plate and the backside gas channel.

17. The substrate support assembly of claim 10, wherein: the annular channel is disposed radially inward of a peripheral edge of the base plate.

18. The substrate support assembly of claim 10, wherein:
a coefficient of thermal expansion of the annular plate is between about 4.7 and 5.

19. A substrate support assembly comprising:
one or more upper plates, wherein:
an uppermost plate of the one or more plates defines a substrate support surface; and
a bottom surface of a lowermost plate of the one or more plates defines an annular recess;
a cooling plate coupled with the bottom surface of the lowermost plate;
a heater embedded within one of the one or more plates;
an electrode embedded within one of the one or more plates and spaced apart from the heater;
an annular plate disposed within the annular recess, the annular plate having a thermal conductivity of less than about 20 W/mK; and
a vacuum sealing element disposed between the annular plate and the cooling plate.

20. The substrate support assembly of claim 19, wherein: the lowermost plate and the uppermost plate are the same plate.

* * * * *